United States Patent [19]
Iijima et al.

[11] Patent Number: 5,571,495
[45] Date of Patent: Nov. 5, 1996

[54] DIELECTRIC THIN FILM OF SUBSTITUTED LEAD TITANATE

[75] Inventors: Takashi Iijima, Sendai; Norio Sanada, Miyagi-ken, both of Japan

[73] Assignee: Japan as represented by Director General of Agency of Industrial Science and Technology, Japan

[21] Appl. No.: 510,270

[22] Filed: Aug. 2, 1995

[30] Foreign Application Priority Data

Aug. 11, 1994 [JP] Japan .................................. 6-210644

[51] Int. Cl.⁶ .................................................. C01G 23/00
[52] U.S. Cl. ........................................ 423/598; 252/62.3 R
[58] Field of Search ........................ 423/598; 252/62.3 R

[56] References Cited

U.S. PATENT DOCUMENTS

| 4,061,583 | 12/1977 | Murata et al. | 423/598 |
| 4,636,378 | 1/1987 | Pastor et al. | 423/598 |

FOREIGN PATENT DOCUMENTS

| 285609 | 12/1986 | Japan | 423/598 |
| 236713 | 10/1988 | Japan | 423/598 |
| 70103 | 3/1993 | Japan | 423/598 |
| 72717 | 3/1994 | Japan | 423/598 |
| 1204436 | 9/1970 | United Kingdom | 252/62.3 R |

*Primary Examiner*—Wayne Langel
*Attorney, Agent, or Firm*—Wenderoth, Lind & Ponack

[57] ABSTRACT

Proposed is a dielectric thin film of a substituted lead titanate having a chemical composition expressed by the formula $$Pb(Ti_{1-x}M_x)O_3$$

in which the subscript x is a positive number in the range from 0.05 to 0.50 and M is an element selected from the group consisting of niobium, tantalum, vanadium, antimony, bismuth, arsenic, tungsten, hafnium, germanium, tin, aluminum and gallium substituting for a part of the titanium atoms in the perovskite crystal lattice of lead titanate. Different from thin films of unsubstituted lead titanate or conventional substituted lead titanates, the above defined dielectric thin films of the invention are free from the disadvantage that the dielectric constant of the thin film is greatly decreased when the thickness of the thin film is so small as to be 1 µm or smaller so that the dielectric constant of the inventive dielectric thin film having a thickness of 0.5 µm or even smaller can be as large as 10 times of that of the thin film of unsubstituted lead titanate having the same thickness.

2 Claims, 2 Drawing Sheets

DIELECTRIC THIN FILM OF SUBSTITUTED LEAD TITANATE

BACKGROUND OF THE INVENTION

The present invention relates to a dielectric thin film of a substituted lead titanate. More particularly, the invention relates to a dielectric thin film of a substituted lead titanate capable of exhibiting a high dielectric constant even when the thickness of the thin film is very small to be 1 μm or smaller.

As is well known, lead titanate of the chemical formula $PbTiO_3$ is a typical ferroelectric material having a crystallographic structure of perovskite. Thin films of lead titanate are promising as a material for infrared sensors, microactuators, memories and the like and extensive investigations are now underway for the development of these applications. One of the serious problems in the application of a thin film of lead titanate as a dielectric material is that the dielectric properties of the thin film depend on the thickness of the thin film and, in particular, the dielectric constant of a thin film of lead titanate is greatly decreased as compared with the value for a bulk of the same material when the thickness of the thin film is 1 μm or smaller. A report in this regard is found, for example, in Proc. FMA-5, page 7 (1985), according to which the dielectric constant of a thin film of lead titanate formed on a substrate by the sol-gel method is only one third to one fourth of the value in bulk when the thin film has a thickness of 1 μm or smaller.

Various proposals and attempts have been made heretofore with an object to provide a lead titanate-based dielectric thin film which does not suffer from a decrease in the dielectric constant when the thickness thereof is decreased including the approaches for the modification of the preparation method of the thin film and introduction of some additive or substituting elements into the crystalline structure of lead titanate. For example, it is reported in Journal of Applied Physics, volume 61, pages 411–415 (1987) and elsewhere that an improvement in the dielectric characteristics can be obtained when a thin film is formed from so-called PLT of $(Pb,La)TiO_3$, which is a lead titanate substituted by lanthanum atoms at a part of the lead atom positions in the crystal lattice of $PbTiO_3$. The improvement obtained by PLT, however, is still insufficient not to impart practicability to lead titanate-based dielectric thin films.

SUMMARY OF THE INVENTION

The present invention accordingly has an object to provide a novel lead titanate-based dielectric thin film having an unexpectedly large dielectric constant even when the thickness of the thin film is so small as to be 1 μm or smaller.

Thus, the present invention provides a dielectric thin film of a substituted lead titanate having a chemical composition expressed by the composition formula $$Pb(Ti_{1-x}M_x)O_3 \quad (I)$$

in which the subscript x is a positive number in the range from 0.05 to 0.50 and M is an element selected from the group consisting of niobium, tantalum, vanadium, antimony, bismuth, arsenic, tungsten, hafnium, germanium, tin, aluminum and gallium substituting for a part of the titanium atoms in the perovskite crystal lattice of lead titanate.

DETAILED DESCRIPTION OF THE PREFERRED EMBODIMENTS

Figure 1:
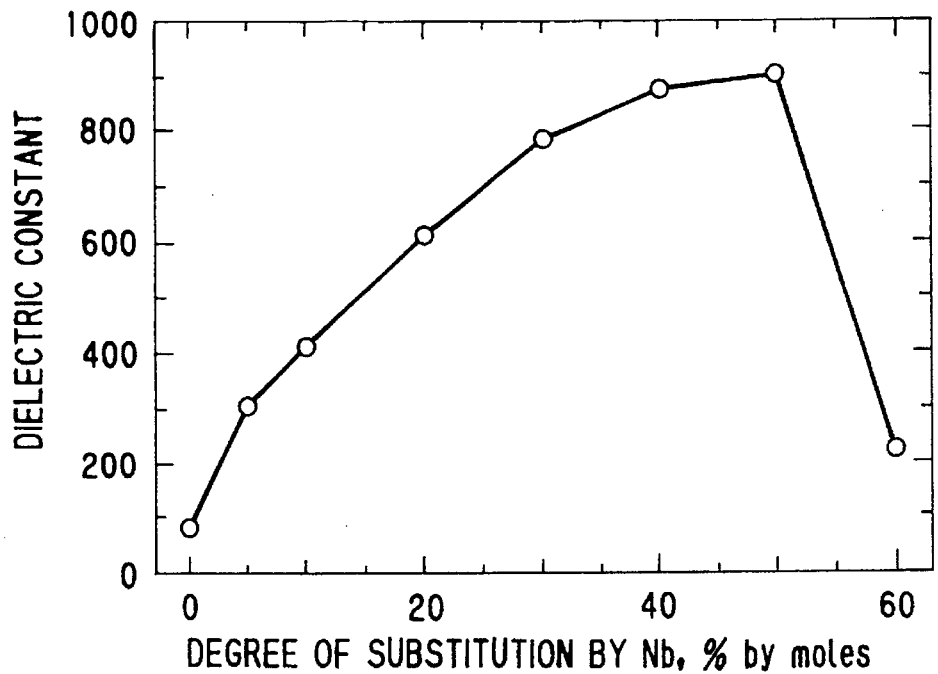
FIG. 1 is a graph showing the dielectric constant of a thin film of $Pb(Ti,Nb)O_3$ as a function of the degree of substitution by niobium for titanium.

The inventors have conducted extensive investigations with the above mentioned object in an approach to discover a substituent element in the crystal lattice of lead titanate to exhibit an improving effect on the dielectric behavior of a thin film of the material. Conducting the experiments with their attention directed to the ionic radius of the substituent element which is in proximity to that of titanium ions of 0.075 nm, a large number of substituent elements were tested arriving at a discovery that the above named substituent elements are specifically effective for the purpose among other elements having an ionic radius within about the same range.

The substituted lead titanate-based dielectric thin film of the present invention has a chemical composition expressed by the above given formula (I), in which the subscript x is a positive number in the range from 0.05 to 0.50 and M is a substituent element selected from the group consisting of niobium, tantalum, vanadium, antimony, bismuth, arsenic, tungsten, hafnium, germanium, tin, aluminum and gallium. Namely, from 5% to 50% by moles or, preferably, from 10 to 50% by moles of the titanium atoms in the perovskite crystal lattice of lead titanate $PbTiO_3$ are replaced with the atoms of these substituent elements to form a solid solution.

These substituent elements can be used either singly or as a combination of two kinds or more according to need. The degree of substitution given by the subscript x should be in the range from 0.05 to 0.50 since, when the value of x is too small, the desired improving effect cannot be fully accomplished as a matter of course while, when the value of x is too large, no uniform solid solution can be formed thereby with appearance of a second crystalline phase consequently to decrease the dielectric constant of the thin film.

Though not limitative, the advantages obtained by the invention are particularly great when the dielectric thin film has a thickness of 1 μm or smaller or in the range from 0.01 to 1 μm. With adequately selected parameters, the dielectric constant of the inventive dielectric thin film can be as large as 10 times of that of a thin film of unsubstituted lead titanate having the same thickness.

The method for the preparation of the dielectric thin film of the invention is not particularly limitative provided that the method ensures controlling of the uniformity of the chemical composition within the range defined by the subscript x in the formula (I). Examples of the applicable methods include the sol-gel method, sputtering method, CVD method, laser ablation method and the like. In the sol-gel method, soluble compounds of lead, titanium and the substituent element such as lead acetate, titanium alkoxide and an alkoxide of the substituent element are dissolved in a suitable solvent such as an alcohol and, after partial hydrolysis of the alkoxides, the solution is applied to the surface of a substrate such as a fused silica glass plate, platinum plate and the like followed by drying of the coating layer to give a film of the dried composition which is then subjected to thermal decomposition of the organic constituents and finally sintered by firing at a temperature up to 700° C. so as to convert the mixed composition into the desired substituted lead titanate in the form of a thin film on the substrate surface. The sputtering method can be performed by using, for example, a RF magnetron sputtering apparatus with a powder of the substituted lead titanate in the form of a powder as the target. The target material can be prepared either by the sol-gel method similar to that described above or by the mixed-oxide calcination method in which the oxides of lead, titanium and the substituent element are intimately mixed together to give a powder blend which is compression-molded into a tablet followed by calcination thereof at a temperature of, for example, 600° C. for 30 to 60 minutes.

In the following, the substituted lead titanate-based dielectric thin film of the invention is described in more detail by way of examples.

EXAMPLE 1

Solutions were prepared by dissolving lead acetate trihydrate, titanium isopropoxide and niobium n-propoxide each in 2-methoxyethanol and these solutions were mixed together in such a varied proportion that the resultant niobium-substituted lead titanate might have a chemical composition of the formula $Pb(Ti_{1-x}Nb_x)O_3$, x being 0.05 to 0.60. The thus prepared mixed solution was applied to the surface of a platinum plate by spin coating followed by drying to remove the solvent and heating at 520° C. to effect thermal decomposition of the organic matter. This procedure of spin coating with the mixed solution and drying and thermal decomposition was repeated several times finally followed by a firing treatment by heating at a temperature of 700° C. for 30 to 60 minutes to give a thin film of the niobium-substituted lead titanate having a thickness of about 0.15 µm. For comparison, another thin film having a thickness of about 0.15 µm was prepared in the same manner as above excepting omission of niobium n-isopropoxide and use of equimolar amounts of lead acetate and titanium isopropoxide in the formulation of the mixed solution.

The thus prepared thin films of the niobium-substituted lead titanate were subjected to the X-ray diffractometric analysis of the crystallographic structure to find that the thin film was constituted of a single phase of perovskite when the degree of substitution by niobium was 50% by moles or lower while, when the degree of substitution by niobium was 60% by moles, an unidentified second phase was detected besides the perovskite phase.

Further, the thin films were subjected to the measurement of the dielectric constant by using a digital LCR meter at a frequency of 10 kHz to give the results shown in FIG. 1 as a function of the degree of substitution by niobium. The dielectric measurement was conducted with the platinum substrate as one of the electrodes and a vapor-deposited film of gold on the dielectric thin film as the other electrode. As is understood from this graph, a great increase is found in the dielectric constant of the thin film, which is about 80 for the thin film of unsubstituted lead titanate as is reported in literatures, reaching about 900 when the degree of substitution by niobium is 50% by moles. In contrast thereto, the dielectric constant of the thin film is rapidly decreased when the degree of substitution by niobium exceeds 50% by moles reaching about 220 with 60% by moles substitution.

EXAMPLE 2

A mixed solution was prepared by dissolving lead acetate trihydrate, titanium isopropoxide and aluminum isopropoxide in 2-methoxyethanol as a solvent in such a varied molar proportion that the composition could be expressed by the formula $Pb(Ti_{1-x}Al_x)O_3$, x being from 0.05 to 0.60, and a powder having a chemical composition expressed by the formula was prepared by gelation of the solution followed by drying thereof and thermal decomposition of the organic matters.

Using the thus prepared powder as the target, a thin film of the aluminum-substituted lead titanate having the same chemical composition as the formula in a thickness of about 0.5 µm was deposited on a platinum plate kept at a temperature of 700° C. by conducting sputtering for 4 hours in a sputtering chamber of a RF magnetron sputtering apparatus filled by a 9:1 by volume mixture of argon and oxygen under a pressure of 1Pa with 300 watts power input for sputtering.

Figure 2:
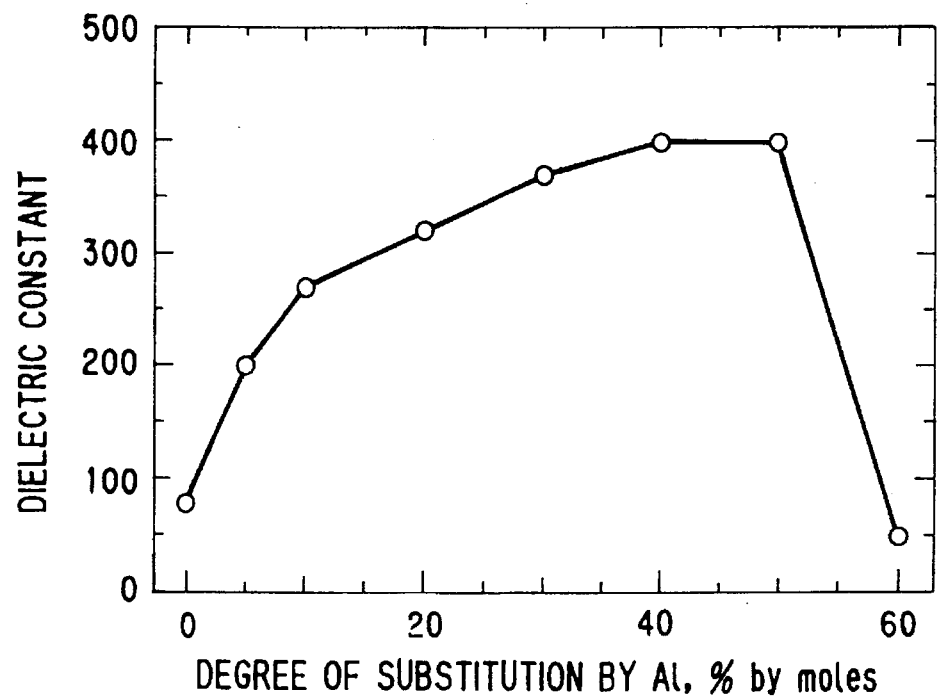
FIG. 2 is a graph showing the dielectric constant of a thin film of $Pb(Ti,Al)O_3$ as a function of the degree of substitution by aluminum for titanium.

The X-ray diffractometric studies of the thus formed thin films led to about the same conclusion as in Example 1 for the crystallographic structure of the aluminum-substituted lead titanates. Further, these thin films on the platinum substrate were subjected to the measurement of the dielectric constant in the same manner as in Example 1 to give the results shown in FIG. 2 as a function of the degree of substitution by aluminum. The highest value of about 400 of the dielectric constant was obtained when the degree of substitution by aluminum was 40 to 50% by moles.

EXAMPLE 3

The experimental procedure was substantially the same as in Example 2 excepting replacement of the aluminum isopropoxide with gallium isopropoxide. The results obtained by the X-ray diffractometric study and measurement of the dielectric constant of the thus formed thin films were also substantially the same as in Example 2.

EXAMPLE 4

Figure 3:
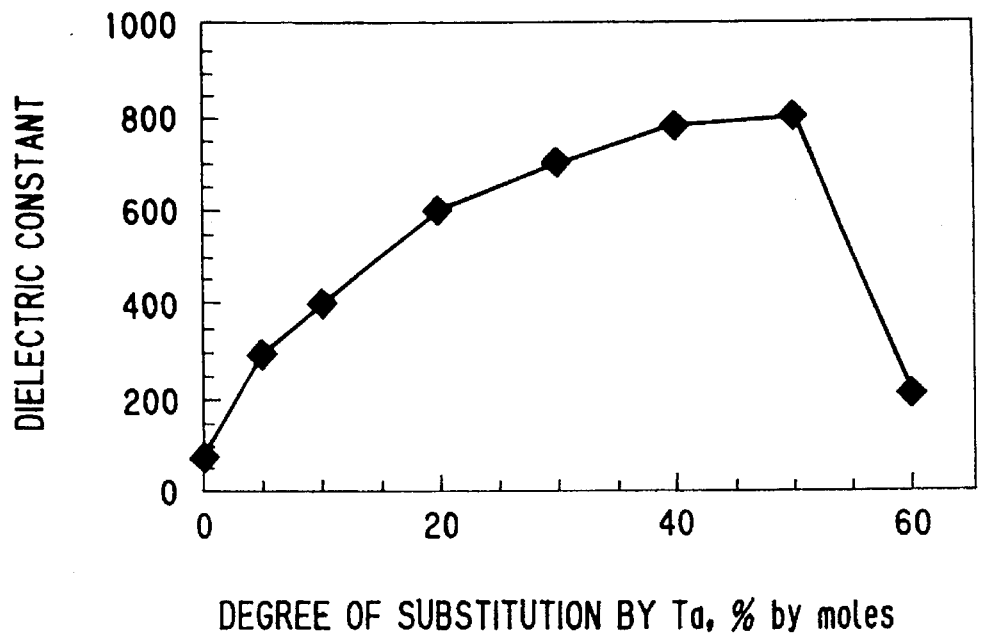
FIG. 3 is a graph showing the dielectric constant of a thin film of $Pb(Ti,Ta)O_3$ as a function of the degree of substitution by tantalum for titanium.

The experimental procedure was substantially the same as in Example 2 excepting replacement of the aluminum isopropoxide with tantalum ethoxide. The result obtained by the X-ray diffractometric study of the thus formed thin films was also substantially the same as in Example 2. FIG. 3 of the accompanying drawing shows the result obtained by the measurement of the dielectric constant of these dielectric thin films as a function of the degree of substitution by tantalum. The highest value of about 800 of the dielectric constant was obtained when the degree of substitution by tantalum was 40 to 50% by moles.

EXAMPLE 5

The experimental procedure was substantially the same as in Example 4 excepting replacement of the tantalum ethoxide with n-propoxy vanadyl. The results obtained by the X-ray diffractometric study and measurement of the dielectric constant of the thus formed thin films were also substantially the same as in Example 4.

EXAMPLE 6

Figure 4:
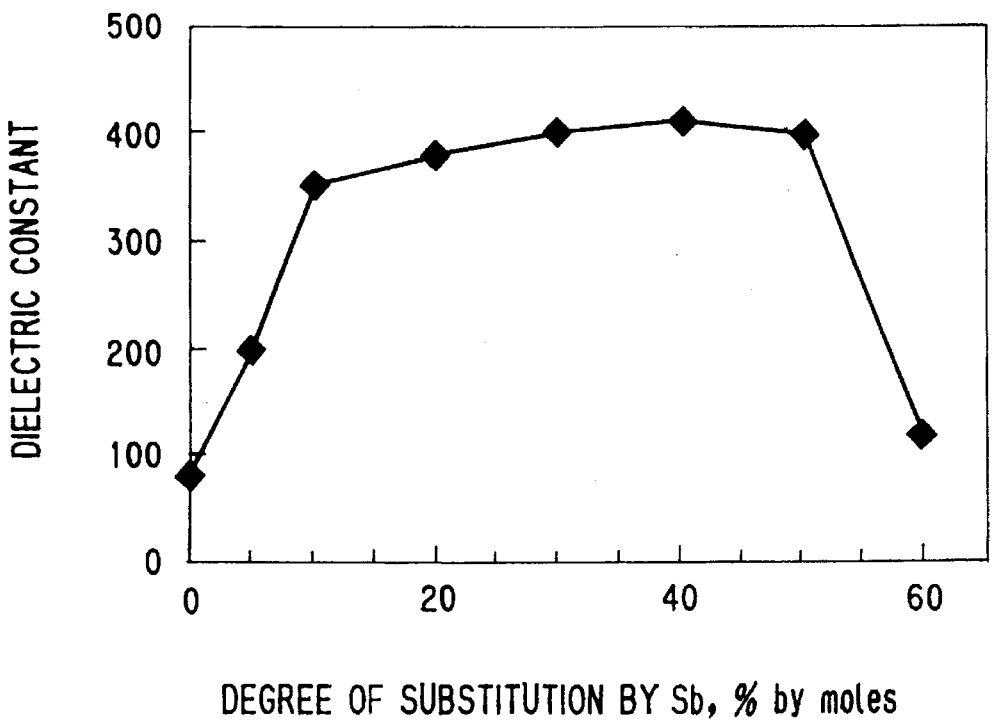
FIG. 4 is a graph showing the dielectric constant of a thin film of $Pb(Ti,Sb)O_3$ as a function of the degree of substitution by antimony for titanium.

The experimental procedure was substantially the same as in Example 2 excepting replacement of the aluminum isopropoxide with antimony ethoxide. The result obtained by the X-ray diffractometric study of the thus formed thin films was also substantially the same as in Example 2. FIG. 4 of the accompanying drawing shows the result obtained by the measurement of the dielectric constant of these dielectric thin films as a function of the degree of substitution by antimony. Different from the preceding examples, the dielectric constant of the dielectric thin films was approximately uniform at about 400 within the range from 20 to 50% by moles of the degree of substitution by antimony.

EXAMPLE 7

The experimental procedure was substantially the same as in Example 6 excepting replacement of the antimony ethoxide with arsenic ethoxide. The results obtained by the X-ray diffractometric study and measurement of the dielectric constant of the thus formed thin films were also substantially the same as in Example 6.

What is claimed is:

1. A dielectric thin film of a substituted lead titanate having a chemical composition expressed by the composition formula $$Pb(Ti_{1-x}M_x)O_3$$

in which the subscript x is a positive number in the range from 0.05 to 0.50 and M is an element selected from the group consisting of niobium, tantalum, vanadium, antimony, bismuth, arsenic, tungsten, hafnium, germanium, tin, aluminum and gallium substituting for a part of the titanium atoms in the perovskite crystal lattice of lead titanate.

2. The dielectric thin film according to claim 1, wherein the thickness of the film is 1 μm or less.

* * * * *